United States Patent
Power

(10) Patent No.: US 8,101,477 B1
(45) Date of Patent: Jan. 24, 2012

(54) METHOD FOR MAKING SEMICONDUCTOR DEVICE

(75) Inventor: John Power, Tainan (TW)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/891,811

(22) Filed: Sep. 28, 2010

(51) Int. Cl.
*H01L 21/8238* (2006.01)
*H01L 21/336* (2006.01)

(52) U.S. Cl. ........ 438/201; 438/211; 438/257; 257/314; 257/E29.129

(58) Field of Classification Search ................ 438/201, 438/211, 257; 257/314, E29.129
See application file for complete search history.

(56) References Cited

U.S. PATENT DOCUMENTS

| | | | |
|---|---|---|---|
| 4,794,565 A | 12/1988 | Wu et al. | |
| 5,073,513 A | 12/1991 | Lee | |
| 6,291,297 B1 | 9/2001 | Chen | |
| 2006/0108628 A1* | 5/2006 | Hung et al. | 257/315 |
| 2006/0166420 A1 | 7/2006 | Van Duuren et al. | |
| 2006/0214211 A1* | 9/2006 | Miyazaki | 257/296 |
| 2011/0070725 A1 | 3/2011 | Power et al. | |

OTHER PUBLICATIONS

Nader Akil et al., "Optimization of Embedded Compact Nonvolatile Memories for Sub-100-nm CMOS generationa", IEE Transactions on Electron Devices, vol. 52, No. 4, Apr. 2005, pp. 492-499.

* cited by examiner

*Primary Examiner* — Hsien Ming Lee
(74) *Attorney, Agent, or Firm* — Infineon Technologies; Phillip Schlazer

(57) ABSTRACT

One or more embodiments relate to a method for forming a memory device, the memory device including a control gate, a charge storage structure and a select gate, the method comprising: forming a gate tower, the gate tower including the control gate over the charge storage structure; forming a dummy tower laterally spaced apart from the gate tower; and forming a select gate between the gate tower and the dummy tower.

11 Claims, 11 Drawing Sheets

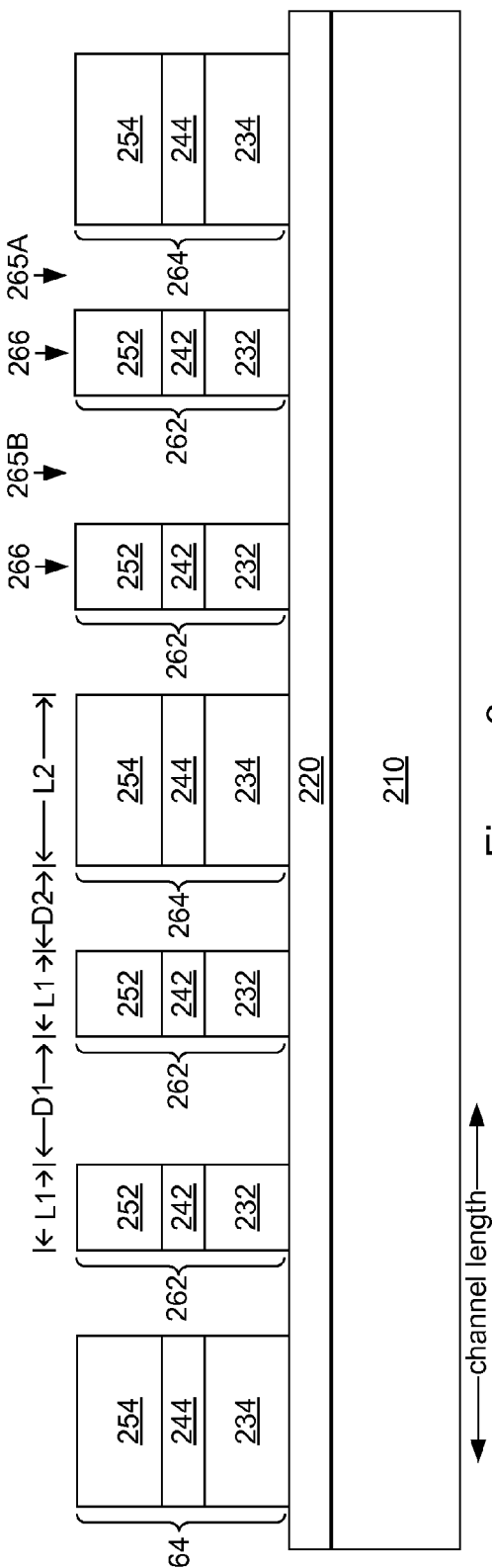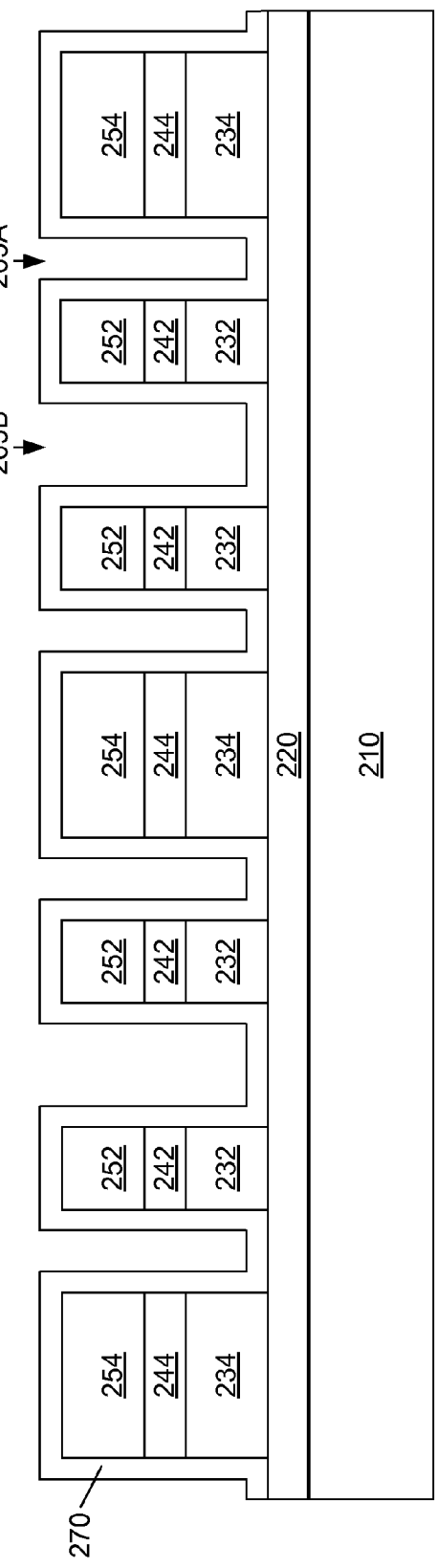
Figure 3
Figure 4

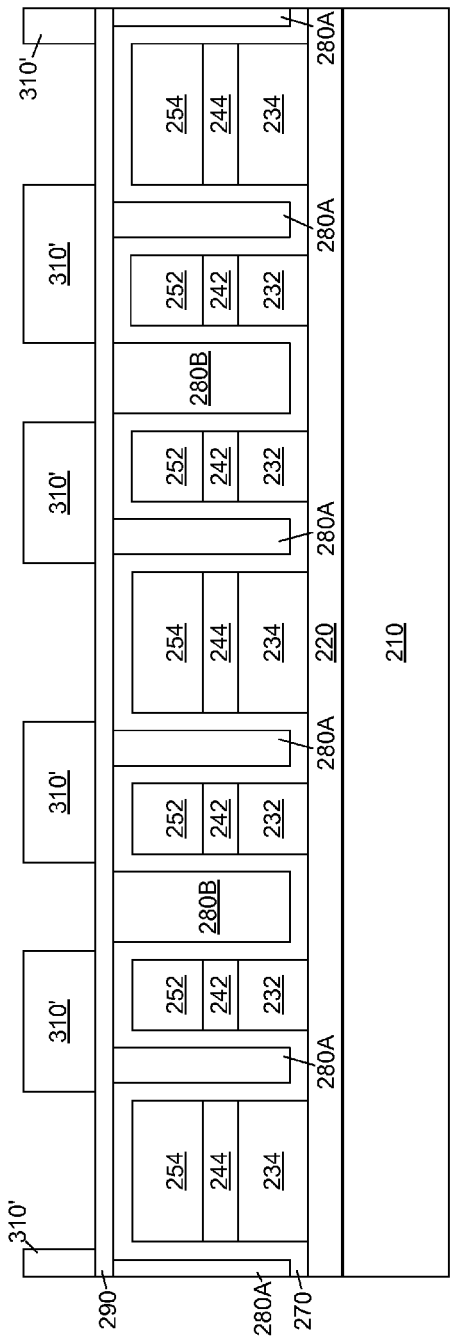
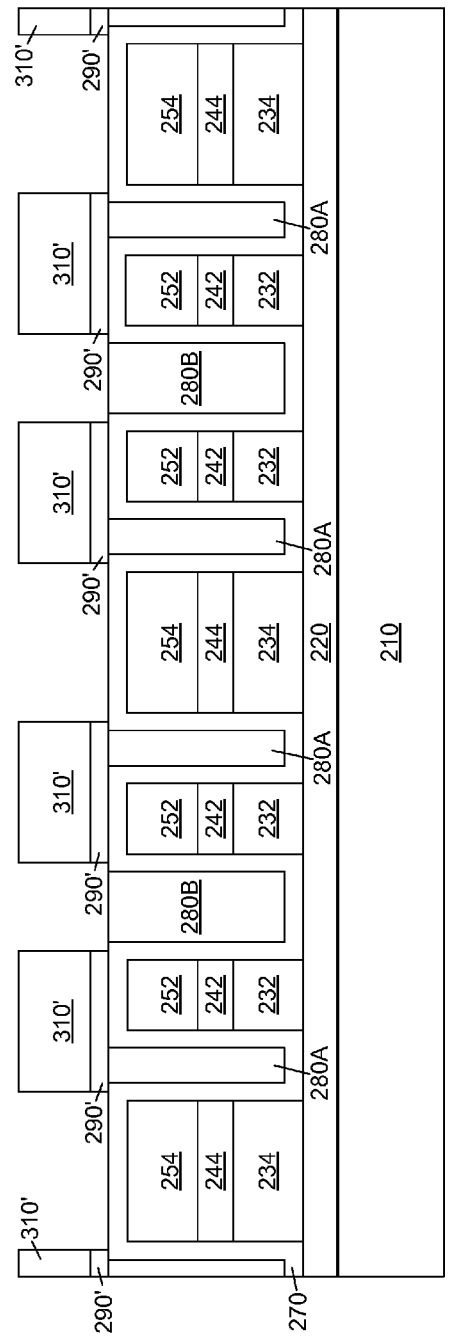

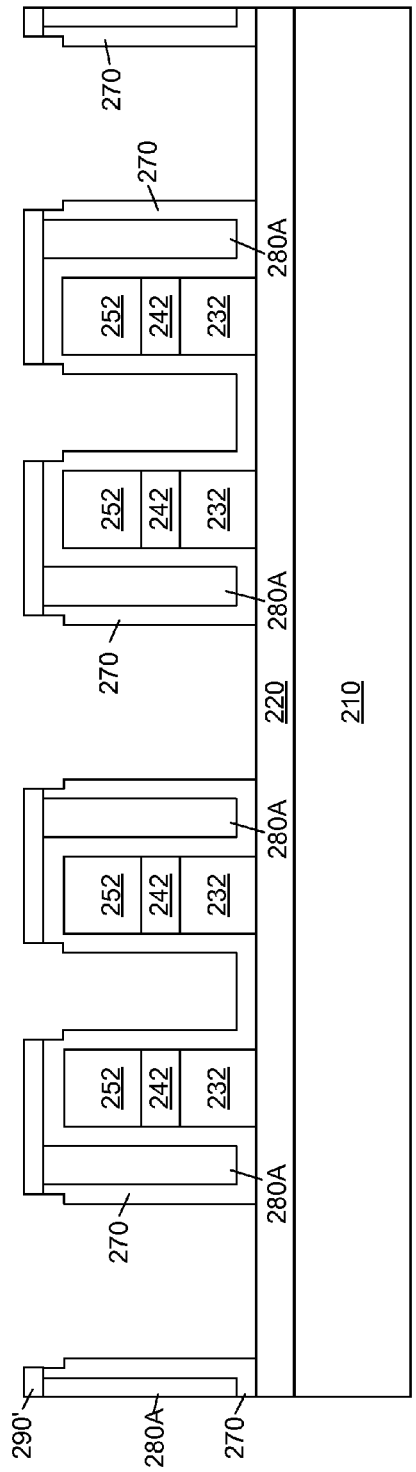
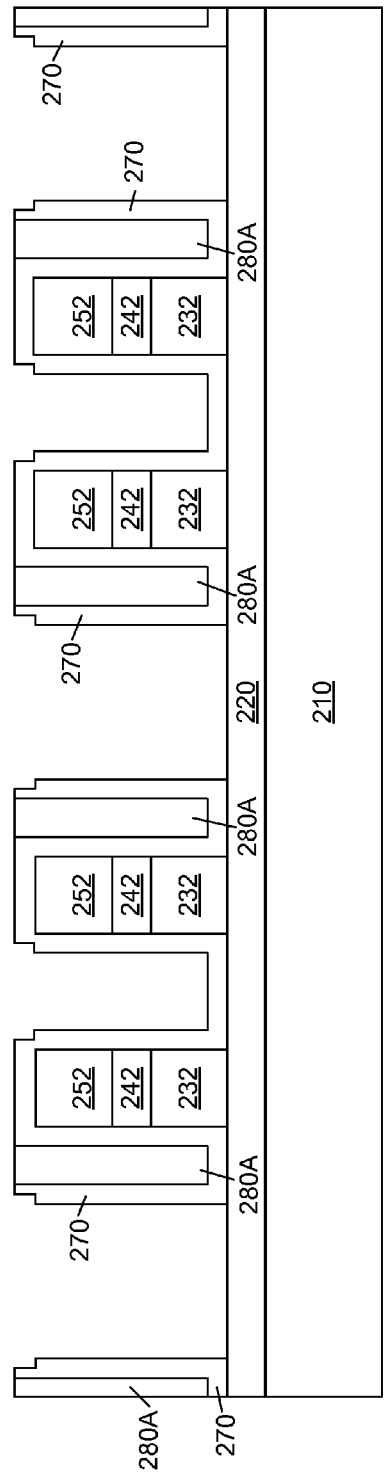
Figure 14
Figure 15

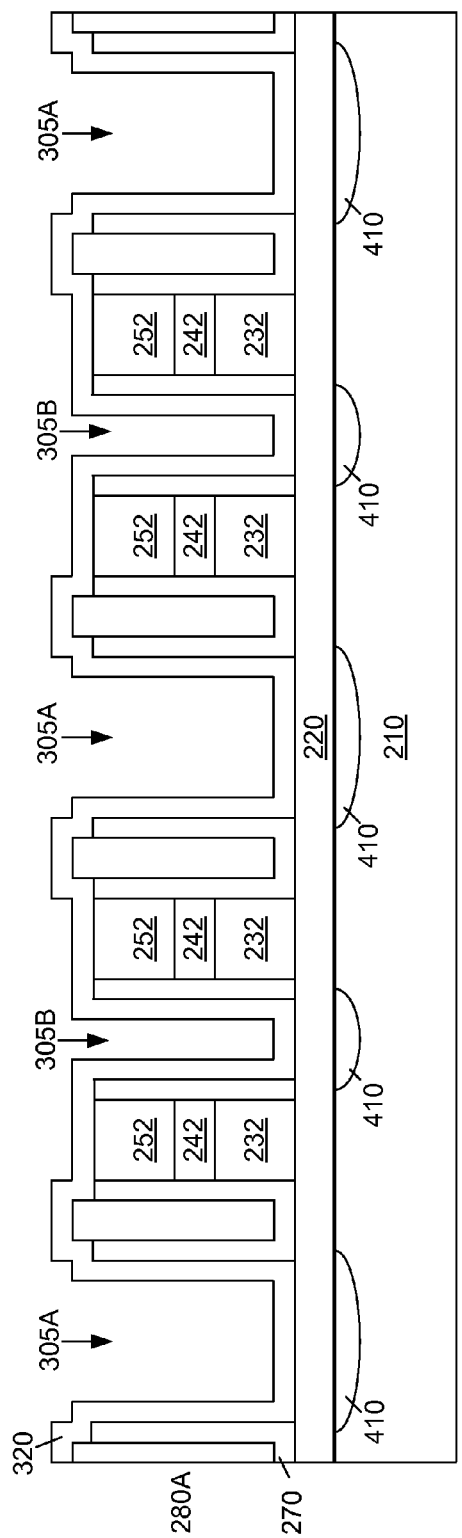
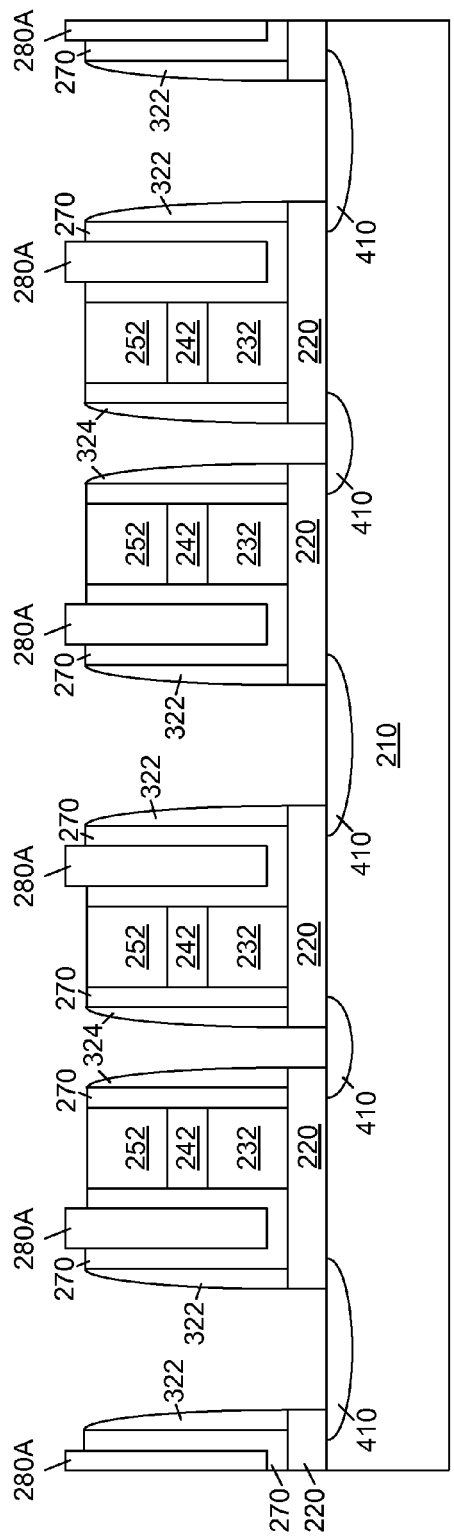
Figure 18
Figure 19

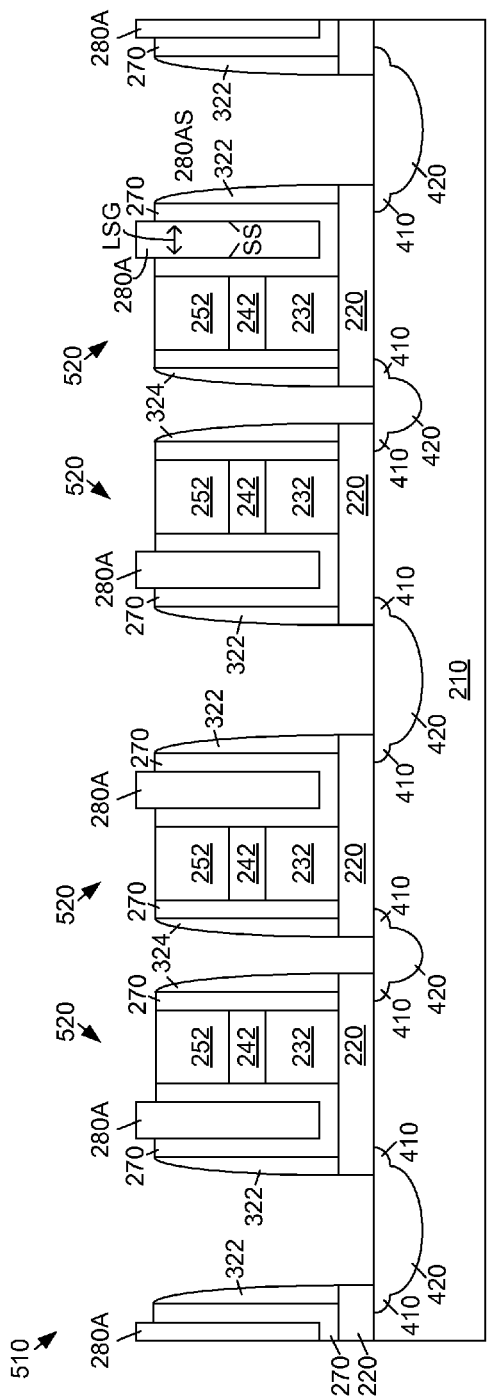
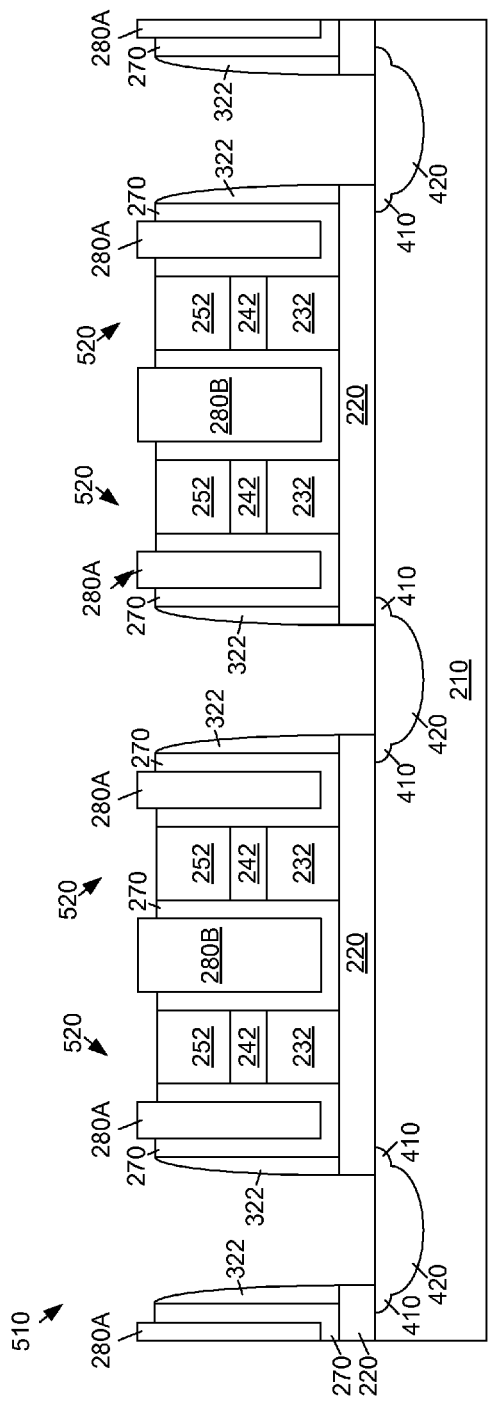

METHOD FOR MAKING SEMICONDUCTOR DEVICE

FIELD OF THE INVENTION

One or more embodiments relate to semiconductor devices and methods of making semiconductor devices.

BACKGROUND OF THE INVENTION

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0". One type of memory device is a charge storage memory device. An example of a charge storage memory device is a floating gate device. Another example of a charge storage memory device is a charge trapping device. New methods of making charge storage memory devices are needed.

BRIEF DESCRIPTION OF THE DRAWINGS

FIGS. 1 through 20 show methods for making a semiconductor structure in accordance with embodiments of the present invention; and FIG. 21 shows an embodiment of the present invention in accordance with an embodiment of the present invention.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
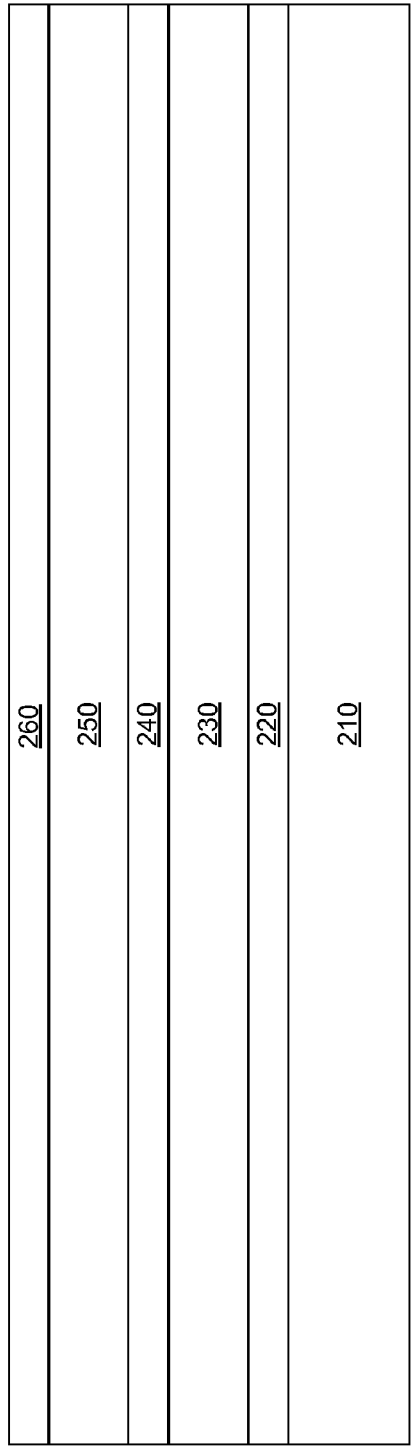

Referring to FIG. 1, a substrate 210 is provided. The substrate 210 may be any type of substrate. The substrate 210 may be a semiconductor substrate. A semiconductor substrate may be a bulk semiconductor substrate (such as a bulk silicon substrate). A semiconductor substrate may be a semiconductor-on-insulator (SOI) substrate such as a silicon on insulator substrate. An SOI substrate may, for example, be formed by an SIMOX process or, for example, by wafer bonding followed by the removal of excess silicon from one of the wafers. A semiconductor substrate may be a silicon-on-sapphire (SOS) substrate or a germanium-on-insulator (GeOI) substrate. A semiconductor substrate may include one or more materials such as semiconductor materials such as silicon germanium, germanium, germanium arsenide, indium arsenide, indium arsenide, indium gallium arsenide, or indium antimonide.

A first dielectric layer 220 may be formed over the substrate 210. The first dielectric layer 220 may comprise one or more dielectric materials. In one or more embodiments, the first dielectric layer 220 may comprise an oxide (such as silicon dioxide $SiO_2$), a nitride (such as silicon nitride, $Si_3N_4$ or $Si_xN_y$), an oxynitride (such as silicon oxynitride, S—O—N or $SiO_xN_y$), or combinations thereof. The first dielectric layer 220 may comprise two or more layers (e.g. sub-layers). The two or more layers may be arranged as a layered stack. The first dielectric layer 220 may comprise, for example, an oxide/nitride stack such as a $SiO_2/Si_xN_y$ stack (where the layers may be in any order), an oxide/nitride/oxide stack (for example, an ONO stack) or combinations thereof.

In one or more embodiments, the first dielectric layer 220 may comprise a high-k dielectric material. The high-k material may have a dielectric constant greater than about 3.9. In one or more embodiments, the high-k material may have a dielectric constant greater than silicon dioxide. In one or more embodiments, the high-k material may have a dielectric constant greater than silicon nitride. In one or more embodiments, the high-k material may have a dielectric constant greater than about 7. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. In one or more embodiments, the first dielectric layer 220 may comprise any other dielectric material or high-k dielectric material. In one or more embodiments, the first dielectric layer 220 may comprise an oxide/high-k stack such as a $SiO_2/Al_2O_3$ stack.

In one or more embodiments, the first dielectric layer 220 may have a thickness of at least 4 nm (nanometers). In one or more embodiments, the first dielectric layer 220 may have a thickness of at least 6 nm. In one or more embodiments, the first dielectric layer 220 may have a thickness of at least 8 nm. In one or more embodiments, the first dielectric layer 220 may have a thickness of less than about 15 nm. In one or more embodiments, the first dielectric layer 220 may have a thickness of less than about 12 nm. In one or more embodiments, the first dielectric layer 220 may comprise a single layer of material or it may comprise two or more layers of material.

The first dielectric layer 220 may be formed in many different ways. For example, the first dielectric layer 220 may be grown by a thermal oxidation, deposited by a chemical vapor deposition (CVD), atomic layer deposition (ALD), physical vapor deposition (PVD), or a jet vapor deposition. Hence, the first dielectric layer 220 may be formed by a growth process or by a deposition process.

A high-k material may be formed, for example, by a deposition process. Examples of deposition processes which may be used include chemical vapor deposition (CVD), physical vapor deposition (PVD), atomic layer deposition (ALD), molecular beam epitaxy (MBE), or other deposition processes.

In one or more embodiments, the first dielectric layer 220 may serve as a tunneling dielectric layer for a floating gate memory device. In another embodiment of the invention, the first dielectric layer 220 may serve as a tunneling dielectric layer for a charge trapping memory device.

In a subsequent processing step, a charge storage layer 230 may be formed over the first dielectric layer 220. In one or more embodiments, the charge storage layer may comprise a conductive material.

In one or more embodiments, the charge storage layer 230 may comprise, for example, a polysilicon material. The polysilicon may be doped with an n-type dopant (such as phosphorus) or a p-type dopant (such as boron). The doping may be accomplished using an ion implantation process or it may be done in-situ. In one or more embodiments, in situ doping involves the addition of dopant gases such as phosphine and diborane to the CVD reactant gases used in polysilicon deposition.

In one or more embodiments, the charge storage layer 230 may comprise a metallic material such as a pure metal or a metal alloy. The charge storage layer may comprise a fullerene. The charge storage layer may comprise a nanotube material. In one or more embodiments, the charge storage layer 230 may comprise a semiconductor material. The charge storage layer may comprise a nanocrystalline material.

In one or more embodiments, the charge storage layer 230 may comprise a dielectric material. The charge storage layer may comprise a nitride material. In one or more embodiments, the charge storage layer 230 may comprise a high-k dielectric material.

In one or more embodiments, the charge storage layer 230 may comprise a metal silicide or a metal nitride.

In one or more embodiments, the charge storage layer 230 may comprise TiN, TiC, HfN, TaN, TaC, TaN, W, Al, Ru, RuTa, TaSiN, NiSix, CoSix, TiSi$_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

The charge storage layer 230 may comprise a single layer or a plurality of stacked layers (such as a polysilicon layer disposed over a metal layer). In one or more embodiments, the thickness of the charge storage layer 230 may be about 30 nm to about 300 nm, however, other thicknesses are also possible. The charge storage layer 230 may be deposited in many different ways. Examples include chemical vapor deposition, physical vapor deposition and atomic layer deposition. In one or more embodiments, the charge storage layer 230 may be a mixture (such as a heterogeneous mixture) of two or more different materials.

In one or more embodiments, the charge storage layer 230 may serve as floating gate layer of a floating gate device. In one or more embodiments, the charge storage layer 230 may serve as a charge trapping layer for a charge trapping device. In one or more embodiments, it is possible that any of the materials described above for the charge storage layer 230 may be useful for either a floating gate layer for a floating gate device or as a charge trapping layer for a charge trapping device.

In one or more embodiments, the charge storage layer 230 may serve as a floating gate layer of a floating gate memory device. Hence, the charge storage layer 230 may include any material that can serve as a floating gate for a floating gate memory device.

In one or more embodiments, the floating gate material may comprise a polysilicon material. The polysilicon material may be polysilicon. The polysilicon may be doped with an n-type dopant (such as phosphorus) or a p-type dopant (such as boron). The doping may be accomplished using an ion implantation process or it may be done in-situ. As noted above, in situ doping may involve the addition of dopant gases such as phosphine and diborane to the CVD reactant gases used in polysilicon deposition.

In one or more embodiments, the floating gate material may comprise any conductive material. In one or more embodiments, the floating gate material may comprise a metallic material such as a pure metal or a metal alloy. In one or more embodiments, the floating gate material may comprise a semiconductor material. In one or more embodiments, it is possible that the floating gate material may comprise a dielectric material. In one or more embodiments, the floating gate material may comprise a metal silicide or a metal nitride. In one or more embodiments, the floating gate material may comprise TiN, TiC, HfN, TaN, TaC, TaN, W, Al, Ru, RuTa, TaSiN, NiSix, CoSix, TiSi$_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the charge storage layer 230 may serve as a charge trapping layer for a charge trapping memory device. Hence, the charge storage layer 230 may include any material that can serve as a charge trapping layer for a charge trapping memory device. Examples of charge trapping materials include, without limitation, nitrides (such as silicon nitride), nanocrystalline materials and, possibly, certain high-k materials. In one or more embodiments, the charge trapping layer may comprise a dielectric material.

Referring again to FIG. 1, after the formation of the charge storage layer 230, a second dielectric layer 240 may be formed over the charge storage layer 230. In one or more embodiments, the second dielectric layer 240 may be formed by a deposition process. In one or more embodiments, the second dielectric layer 240 may be formed by a growth process. The second dielectric layer 240 may comprise one or more dielectric materials. In one or more embodiments, the second dielectric layer 240 may comprise an oxide (such as silicon dioxide SiO$_2$), a nitride (such as Si$_3$N$_4$ or Si$_x$N$_y$) an oxynitride (such as silicon oxynitride, S—O—N or SiO$_x$N$_y$), or combinations thereof. In one or more embodiments, the second dielectric layer 240 may comprise a stack of two or more layers (or a stack of three or more layers) such as an oxide/nitride stack such as a SiO$_2$/Si$_3$N$_4$ or an SiO$_2$/Si$_x$N$_y$ stack or a nitride/oxide stack, an oxide/nitride/oxide stack (for example, an ONO stack) or combinations thereof.

In one or more embodiments, the second dielectric layer 240 may comprise a high-k dielectric material. The high-k material may have a dielectric constant greater than 3.9. The high-k material may have a dielectric constant greater than silicon dioxide. In one or more embodiments, the high-k material may have a dielectric constant greater than silicon nitride. In one or more embodiments, the high-k material may have a dielectric constant greater than 7. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, HfO$_2$, HfSiO$_x$, HfAlO$_x$, HfAlO$_x$N$_y$, HfSiAlO$_x$, HfSiAlO$_x$N$_y$, Al$_2$O$_3$, ZrO$_2$, ZrSiO$_x$, Ta$_2$O$_5$, SrTiO$_3$, La$_2$O$_3$, Y$_2$O$_3$, Gd$_2$O$_3$, Pr$_2$O$_3$, TiO$_2$, ZrAlO$_x$, ZrAlO$_x$N$_y$, SiAlO$_x$, SiAlO$_x$N$_y$, ZrSiAlO$_x$, ZrSiAlO$_x$N$_y$, or combinations thereof. The high-k material may comprise Al$_2$O$_3$. Alternatively, the second dielectric layer 240 may comprise any other dielectric material or high-k dielectric material.

In one or more embodiments, the second dielectric layer 240 may have a thickness of at least 4 nm (nanometers). In one or more embodiments, the second dielectric layer may have a thickness of at least 6 nm. In one or more embodiments, the second dielectric layer may have a thickness of at least 8 nm. In one or more embodiment, the second dielectric layer 240 may have a thickness of less than about 20 nm. In one or more embodiments, the second dielectric layer 240 may have a thickness of less than about 15 nm. Other thicknesses are also possible. In one or more embodiments, the second dielectric layer 240 may comprise a single layer of material or it may comprise two or more layers of material.

The second dielectric layer 240 may be formed in many different ways. In one or more embodiments, the second dielectric layer 240 may be formed by deposition process. In one or more embodiments, the second dielectric layer 240 may be formed by a growth process (such as a thermal growth process). For example, the second dielectric layer may be grown by a thermal oxidation, deposited by a chemical vapor deposition (CVD), atomic layer deposition (ALD), physical vapor deposition (PVD), or a jet vapor deposition. Hence, the second dielectric layer may, for example, be formed by a growth process or by a deposition process.

As noted above, a high-k material may be formed, for example, by a deposition process. Examples of deposition process which may be used include chemical vapor deposition (CVD), physical vapor deposition (PVD), atomic layer deposition (ALD), molecular beam epitaxy (MDE), or other deposition processes.

In one or more embodiments, the second dielectric layer 240 may serve as an inter-gate dielectric layer between a floating gate and a control gate of a floating gate memory device. In one or more embodiments, the floating gate and the control gate may both be formed of polysilicon such as a doped polysilicon. The doped polysilicon may be n-doped or p-doped. In this case, the second dielectric layer 240 may serve as an interpoly dielectric material. The second dielectric layer 240 may serve as a dielectric layer between a control gate and a charge trapping layer.

It is noted that the use of a high-k material as an inter-gate dielectric layer (or as an interpoly dielectric layer) in a floating gate memory device may be beneficial since the larger dielectric constant may lead to larger capacitive coupling. This may lead to a reduction in the power needed to operate the device.

Next, a control gate layer 250 may be formed over the second dielectric layer 240. The control gate layer 250 may be an upper gate layer. In one or more embodiments, the control gate layer 250 may be formed of any conductive material. Hence, in one or more embodiments, the control gate layer 250 may comprise any conductive material.

In one or more embodiments, the control gate layer 250 may comprise, for example, polysilicon. The polysilicon may be doped with an n-type dopant (such as phosphorus) or a p-type dopant (such as boron). The doping may be accomplished using an ion implantation process. In one or more embodiments, it is conceivable that the doping may be done in-situ. In one or more embodiments, doping may be at least partially accomplished after the formation of the gate stack as explained below. In one or more embodiments, doping of the control gate layer 250 may be at least partially accomplished during the formation of the extension regions and/or the source/drain regions.

In one or more embodiments, the control gate layer 250 may comprise a metallic material such as a pure metal or a metal alloy. In one or more embodiments, the control gate layer 250 may be any other material suitable as a control gate for a charge storage memory device. In one or more embodiments, the control gate layer 250 may comprise a metal silicide or a metal nitride. In one or more embodiments, the control gate layer 250 may comprise TiN, TiC, HfN, TaN, TaC, TaN, W, Al, Ru, RuTa, TaSiN, NiSix, CoSix, TiSi$_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

The control gate layer 250 may comprise a single layer or a plurality of stacked layers (such as a polysilicon layer disposed over a metal layer or a metal layer disposed over a polysilicon layer). The control gate layer 250 may comprise a mixture (such as a heterogeneous mixture) of two or more different materials. In one or more embodiments, the thickness of the control gate layer 250 may be about 30 nanometer to about 300 nanometer, however, other thicknesses are also possible. The control gate layer 250 may be deposited in many different ways. Examples, include chemical vapor deposition, physical vapor deposition and atomic layer deposition.

Still referring to FIG. 1, a masking layer 260 may be formed over the control gate layer 250. The masking layer 260 may comprise a photoresist material. The masking layer 260 may be a photoresist layer.

Figure 2:
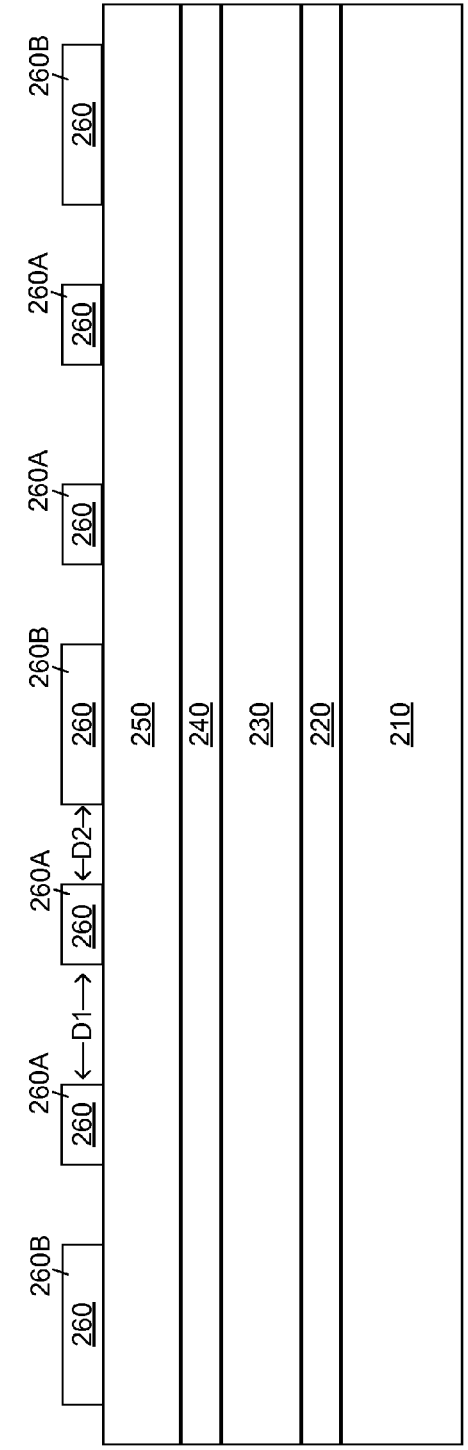

Referring to FIG. 2, the masking layer 260 may be patterned to form one or more first masking portions 260A as well as one or more second masking portions 260B. In one or more embodiments, a second masking portion 260B may be wider than a first masking portion 260A. A first masking portion 260A may be laterally spaced apart from an adjacent first masking portion 260A by a distance D1. A first masking portion 260A may be laterally spaced from an adjacent second masking portion 260B by a distance D2. In one or more embodiments, the distance D1 may be greater than the distance D2.

In a subsequent processing step, the control gate layer 250, the dielectric layer 240 and the charge storage layer 230 may be patterned to form gate towers 262 and dummy towers 264 as shown in FIG. 3. The pattering may be performed by an etching process. The etching process may comprise a dry etching process. In one or more embodiments, the gate towers 262 and the dummy towers 264 may be formed at the same time.

The gate tower 262 may include a charge storage layer 232 which is a portion of the charge storage layer 230 from FIG. 1. The charge storage layer 232 may also be referred to as a charge storage structure. The charge storage structure 232 may be a floating gate (e.g. including floating gate material) or it may be a charge trapping structure (e.g. including charge trapping material). The gate tower 262 may include a second dielectric layer 242 which is a portion of second dielectric layer 240 from FIG. 1. The gate tower 262 may include a control gate layer 252 which is a portion of control gate layer 250 from FIG. 1. The control gate layer 252 may also be referred to as a control gate.

The dummy tower 264 may include a dummy charge storage layer 234 which is a portion of the charge storage layer 230 from FIG. 1. The dummy charge storage layer 234 may also be referred to as a dummy charge storage structure. The dummy tower 264 may include a dummy second dielectric layer 244 which is a portion of second dielectric layer 240 from FIG. 1. The dummy tower 264 may include a dummy control gate layer 254 which is a portion of control gate layer 250 from FIG. 1. The dummy control gate layer 254 may also be referred to as a dummy control gate.

It is noted that the etch process to form each of the gate towers 262 and the dummy towers 264 may take one or two or more etching steps. In one or more embodiments, at least one etch chemistry may be involved. In one or more embodiments, at least two etch chemistries may be involved.

In one more embodiments, the gate towers 262 as well as the dummy towers 264 may be disposed over first dielectric layer 220. It is noted that the gate towards 262 in combination with the dielectric layer 220 may be referred to as gate stacks 266. Hence, a gate stack 266 may include layers 252, 242, 232, 220.

Referring to FIG. 3, in one or more embodiments, the etch process to form the gate towers 262 and dummy towers 264 may stop on the first dielectric layer 220. In one or more embodiments, the etch process may not substantially etch the first dielectric layer 220. However, in one or more embodiments, it is also possible that portions of the first dielectric layer 220 which are not underlying the mask portions 260A,B may be at least partially etched through. In one or more embodiments, it is possible that these portions of first dielectric layer 220 may be totally etched through.

The first dielectric layer 220 (regardless of whether or not it is etched) may serve as a tunneling dielectric for the charge storage memory devices that will be formed. In one or more embodiments, the charge storage memory device may be a floating gate device. In one or more embodiments, the charge storage memory device may be a charge trapping device.

The gate towers 262 may have a lateral dimension L1 while the dummy towers 264 may have a lateral dimension L2. The lateral dimensions L1 and L2 may be measured in the same lateral direction. The lateral direction may be in the direction of channel length. In one or more embodiments, the lateral dimension L1 may be less than the lateral dimension L2. Hence, the dimensions L1 and L2 may be referred to as length L1 of the gate tower 262 (or length of the gate stack 266) as well as the length L2 of the dummy tower 264. The lateral distance between two adjacent gate towers 262 may be distance D1. The lateral distance between a gate stack 262 and an adjacent dummy stack 264 may be distance D2. In one or more embodiments, the distance D1 may be greater than the distance D2.

In a subsequent processing step, a dielectric layer 270 may be formed over the structure shown in FIG. 3 to form the structure shown in FIG. 4. The dielectric layer 270 may be formed by either a growth process or by a deposition process. The deposition process may comprise a substantially conformal deposition process. The dielectric layer 270 may be formed on the top and sidewall surface(s) of each of the gate towers 262, dummy towers 264 as well as over the exposed portions of the first dielectric layer 220. The dielectric layer 270 may be formed over the sidewall surfaces of the layers 232, 242 and 252 of gate tower 262 as well as over the sidewall surfaces of the layers 234, 244 and 254 of dummy tower 264. When a growth process is used, it is possible that the dielectric layer 270 may not substantially grow on the sidewall surfaces of the second dielectric layers 242, 244. Referring to FIG. 4, as a result of layer 270 an opening 265A' may be formed within opening 265A and an opening 265B' may be formed within the opening 265B.

The dielectric layer 270 may comprise one or more dielectric materials. The dielectric layer 270 may comprise any dielectric material. In one or more embodiments, the dielectric layer 270 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the dielectric layer 270 may comprise a stack of two or more layers (or a stack of three or more layers) such as an oxide/nitride stack such as a $SiO_2/Si_3N_4$ or an $SiO_2/Si_xN_y$ stack or a nitride/oxide stack, an oxide/nitride/oxide stack (for example, an ONO stack) or combinations thereof. In one or more embodiments, the dielectric layer 270 may comprise a high-k dielectric material.

Figure 5:
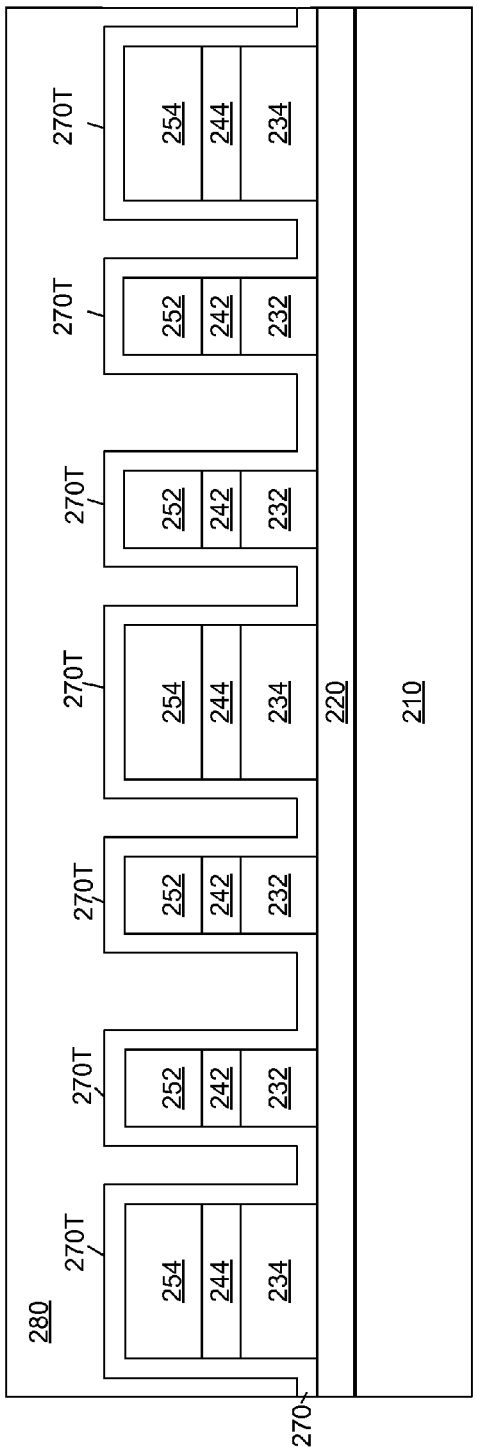

Referring now to FIG. 5, an additional gate layer 280 may be formed over the structure shown in FIG. 4 to form the structure shown in FIG. 5. The additional gate layer 280 may be formed over the dielectric layer 270. The additional gate layer 280 may be formed within the openings between the gate towers and may fill the openings. The additional gate layer 280 may additionally overly the top surfaces of gate towers 262 and dummy towers 264. In one or more embodiments, the top surface of the additional gate layer 280 may be above the top surfaces of the dielectric layer 270. The additional gate layer 280 may be formed by a growth process or by a deposition process. In one or more embodiments, the deposition process may be a substantially conformal deposition process.

In one or more embodiments, the additional gate layer 280 may have a thickness of about 100 nm (nanometers) or greater. In one or more embodiments, the additional gate layer 280 may have a thickness of about 200 nm or greater. In one or more embodiments, the additional gate layer 280 may have a thickness of about 300 nm or greater. In one or more embodiments, the additional gate layer 280 may have a thickness of about 400 nm or greater. In one or more embodiments, the additional gate layer 280 may have a thickness of about 500 nm or greater.

In one or more embodiments, the additional gate layer 280 may be a polysilicon layer. In one or more embodiments, the additional gate layer 280 may comprise (or may consist essentially) of polysilicon. The polysilicon may be a doped polysilicon which may be doped with an n-type dopant (such as phosphorus) or a p-type dopant (such as boron). The doping may be accomplished using an ion implantation process or be done in-situ. In one or more embodiments, doping of the additional gate layer 280 may be at least partially accomplished during the formation of the extension regions and/or the source/drain regions. The formation of the extension regions and the source/drain regions is explained below.

Figure 6:
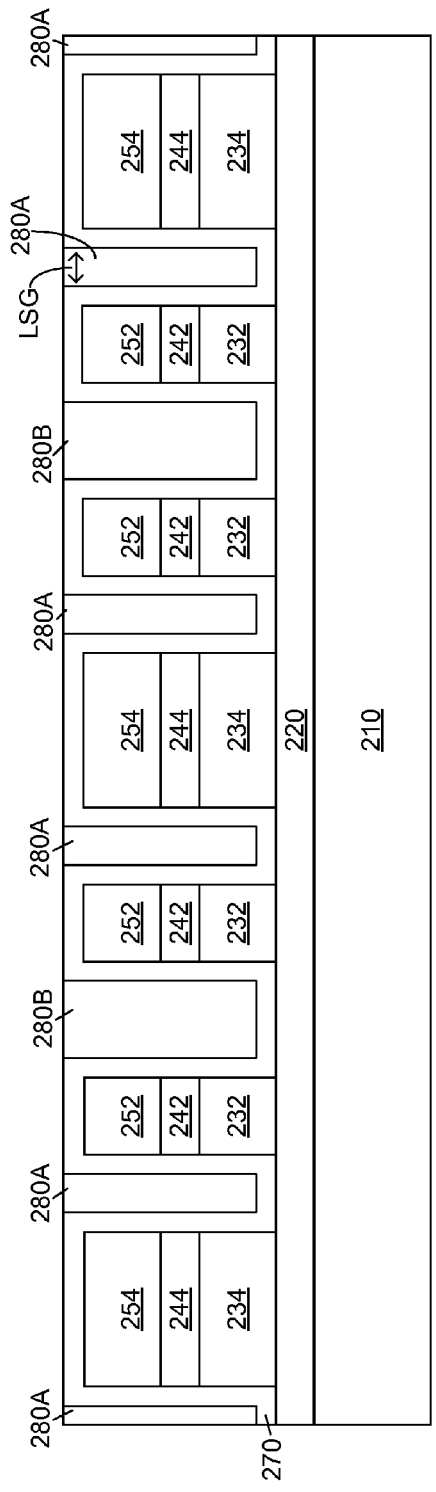

In one or more embodiments, the additional gate layer 280 may be doped after the formation of the additional gate layer 280 (as shown in FIG. 5) or after one or more subsequent processing steps such as after the formation of the additional gate structures 280A, 280B (as shown in FIG. 6). In one or more embodiments, the additional gate layer 280 may be a polysilicon layer (e.g. a doped polysilicon layer).

In one or more embodiments, the additional gate layer 280 may be a conductive layer. The additional gate layer may comprise one or more conductive materials. In one or more embodiments, the additional gate layer 280 may comprise a metallic material such as a metal and/or a metallic alloy and/or a metallic compound. In one or more embodiments, the additional gate layer 280 may be any other material suitable, for example, as a select gate for a charge storage memory device. In one or more embodiments, the additional gate layer 280 may comprise a metal silicide or a metal nitride. In one or more embodiments, the additional gate layer 280 may comprise TiN, TiC, HfN, TaN, TaC, TaN, W, Al, Ru, RuTa, TaSiN, NiSix, CoSix, $TiSi_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof. The additional gate layer 280 may comprise a combination or mixture of the two or more materials.

As discussed, the additional gate layer 280 may be a conductive layer. In one or more embodiments, the additional gate layer 280 may be deposited as a conductive layer or it may be made conductive in a subsequent processing step after being deposited.

In one or more embodiments, the additional gate layer may comprise a material useful as a select gate.

Referring to FIG. 6, in a subsequent processing step, a portion of the additional gate layer 280 as shown in FIG. 5 may be removed to form the structure shown in FIG. 6. In one or more embodiments, the removal of a portion of the additional gate layer 280 may comprise an etching process. In one or more embodiments, the etching process may comprise a dry etching process. In one or more embodiments, the dry etching process may comprise a plasma etching process. In some embodiments the dry etching process may comprise anisotropic and/or isotropic etching components.

In one or more embodiments, the dry etching process may comprise a reactive ion etch (RIE). In one or more embodiments, the reaction ion etch (RIE) may include both a reactive chemical process and a physical process using ion bombardment.

In one or more embodiments, the etching process may include one or more (and possibly two or more) etch chemistries.

In one or more embodiments, the additional gate layer 280, shown in FIG. 5 may be etched by a timed or endpointed RIE etch where the endpoint may be found when the etch (which may, for example, be a polysilicon etch) reaches the dielectric layer 270 which covers the gate towers 262 and dummy towers 264.

In one or more embodiments, the removal process to remove a portion of the additional gate layer 280 shown in FIG. 5 so as to form the structure shown in FIG. 6 may comprise a chemical mechanical polishing process.

In one or more embodiments, the etch process used to etch the relatively thick additional gate layer 280 may be performed without first masking layer formed over the additional gate layer 280. In one or more embodiments, the etching process to etch the additional gate layer 280 may include an etch-back process.

In one or more embodiments, the etching process to etch the additional gate layer 280 may comprise a wet etching process. In one or more embodiments, the wet etching process may be an isotropic etching process. In one or more embodiments, the etchant used for the wet etching process may comprise potassium hydroxide (KOH).

In one or more embodiments, the etching process may use the dielectric layer 270 as an etch-stop layer.

In one or more embodiments, the etching process to etch the additional layer 280 may not require a masking step.

Referring to FIG. 6, in some embodiments, the additional gate layer 280 shown in FIG. 5 may be etched to remove that portion of the additional gate layer 280 that is above the surfaces 270T of the dielectric layer 270. As a result of the etch of the additional gate layer 280, portions 280A,B of the additional gate layer 280 are formed. In one or more embodiments, the portions 280A,B may be individual structures which may be spaced apart from each other. In one or more embodiments, the portions 280A,B may be electrically isolated from each other. In one or more embodiments, the portions 280A,B may have top surfaces which may be at or below the top surfaces 270T of dielectric layer 270. The portions 280A,B may be referred to as additional gate structures 280A,B.

Hence, a portion of the additional gate layer 280 shown in FIG. 5 may thus be removed to leave portions 280A,B of the additional gate layer 280. The portions 280A,B may be referred to as additional gate structures 280A,B.

In one or more embodiments, the additional gate structures 280A,B may be spaced apart from each other. In one or more embodiments, the additional gate structures 280A,B, may be electrically isolated from each other. In one or more embodiments, the additional gate structures 280A may be spaced apart from each other. In one or more embodiments, the additional gate structures 280A may be electrically isolated from each other. In one or more embodiments, the additional gate structures 280B may be spaced apart from each. In one or more embodiments, the additional gate structures 280B may be electrically isolated from each other.

Referring to FIG. 6, it is seen that the additional gate structures 280A may be formed between a gate tower 262 and a dummy tower 264 while additional gate structures 280B may be between two gate towers 262.

The additional gate structures 280A may be referred to as select gates. The lateral dimension LSG may be referred to as the length of a select gate 280A. The length LSG of the select gate 280A may be measured in the direction of channel length. The lateral dimension LSG may be controlled by adjusting the lateral dimension D2 between a gate tower 262 and an adjacent dummy tower 264. Of course, other layers such as layer 270 that are formed within opening 265A may contribute to determine the final length LSG of the select gate 280A. In one more embodiments, the length LSG of the select gate 280A may be the same as the lateral dimension of opening 265A' where the lateral dimension is in the direction of channel length.

Referring to FIGS. 1 through 6, after the masking step shown in FIG. 2 to form the gate towers 262 and dummy towers 264 shown in FIG. 3, in one or more embodiments, an additional masking step may not be needed to form the select gates 280A shown in FIG. 6.

Figure 7:
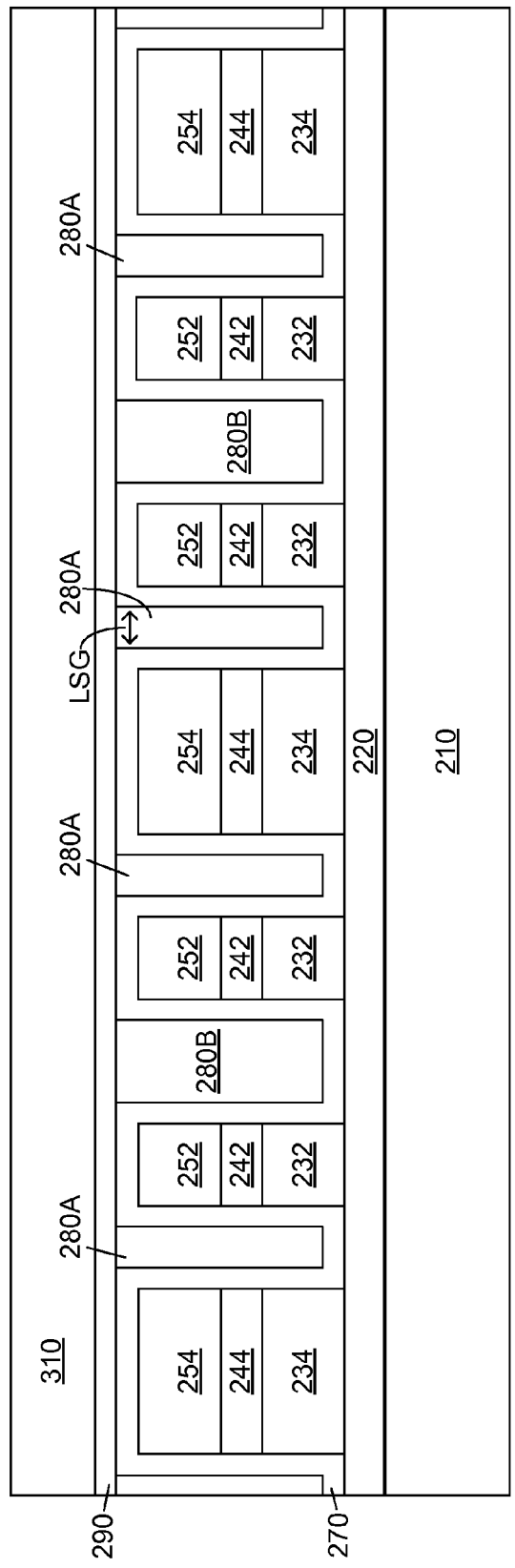

Referring to FIG. 7, an optional dielectric layer 290 may be formed over the structure shown in FIG. 7. The dielectric layer 290 may comprise one or more dielectric materials. The dielectric layer 290 may comprise any dielectric materials. In one or more embodiments, the dielectric layer 290 may comprise an oxide (such as silicon dioxide $SiO_2$), a nitride (such as silicon nitride, $Si_3N_4$ or $Si_xN_y$), an oxynitride (such as silicon oxynitride, S—O—N or $SiO_xN_y$), or combinations thereof.

Referring to FIG. 7, a masking layer 310 may be formed over the dielectric layer 290. The masking layer 310 may comprise a photoresist material. Referring to FIG. 8, the masking layer 310 may be patterned to form masking portions 310'. The masking portions 310' may overlie at least a portion of each of the gate towers 262 and a portion of each of the select gates 280A which is between a gate tower 262 and a dummy tower 264.

Referring to FIG. 9, the masking portions 310' are used as masks to etch portions of dielectric layer 290 that are not covered by masking portions 310'. The etching process used to etch dielectric layer 290 include a dry etch process. The dry etch process may comprise a plasma etch. The etching process used may be a reactive ion etch (RIE). The etching process may comprise an anisotropic etching process. After the etch, dielectric layer portions 290' remain.

Figure 10:
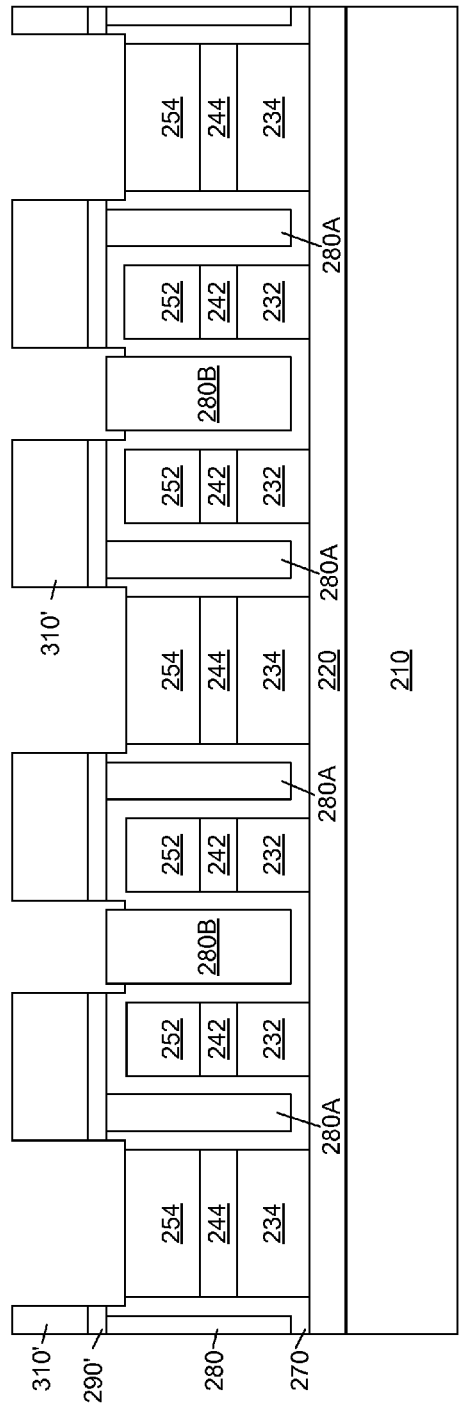

Referring to FIG. 9, the masking portions 310' may still be used as a mask (possibly in combination with remaining dielectric layer portions 290') to etch the dielectric layer 270. Referring to FIG. 10, it is seen that portions of the dielectric layer 270 may be removed. The removed portions of dielectric layer 270 may be those portions that overlie the dummy towers 264 as well as the additional gate structures 280B. The dielectric layer 270 may remain over the gate stacks 262 as well as over the select gates 280A.

Figure 11:
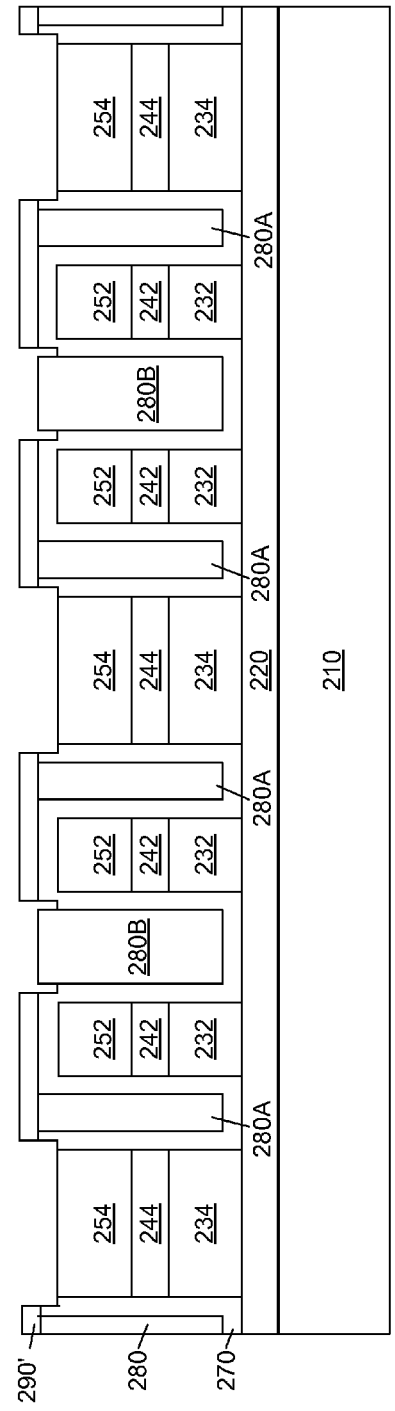

Referring to FIG. 11, the masking portions 310' may then be removed. The dielectric layer portions 290' may still be in place.

Figure 12:
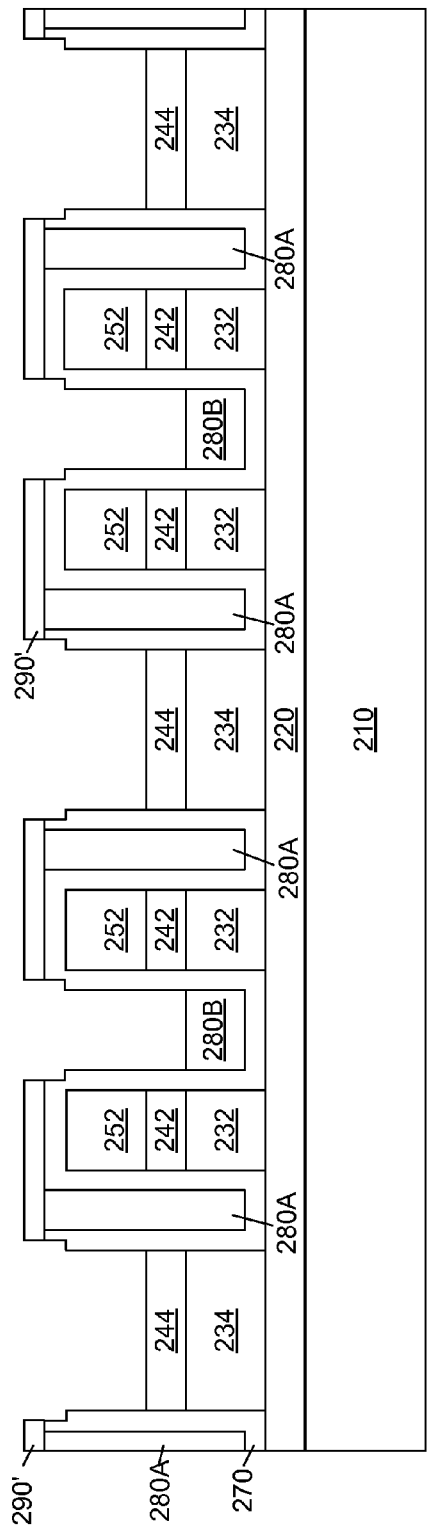

Referring to FIG. 12, the dummy control gate layers 254 (e.g. dummy control gates) may be removed from the dummy tower 264. The removal may include an etching process. In one or more embodiments, the etching process may be a dry etching process. In one or more embodiments, the etching process may be a wet etching process. The etching process may include a polysilicon etching process. The same removal process may remove at least a portion of each of the additional gate structures 280B.

Figure 13:
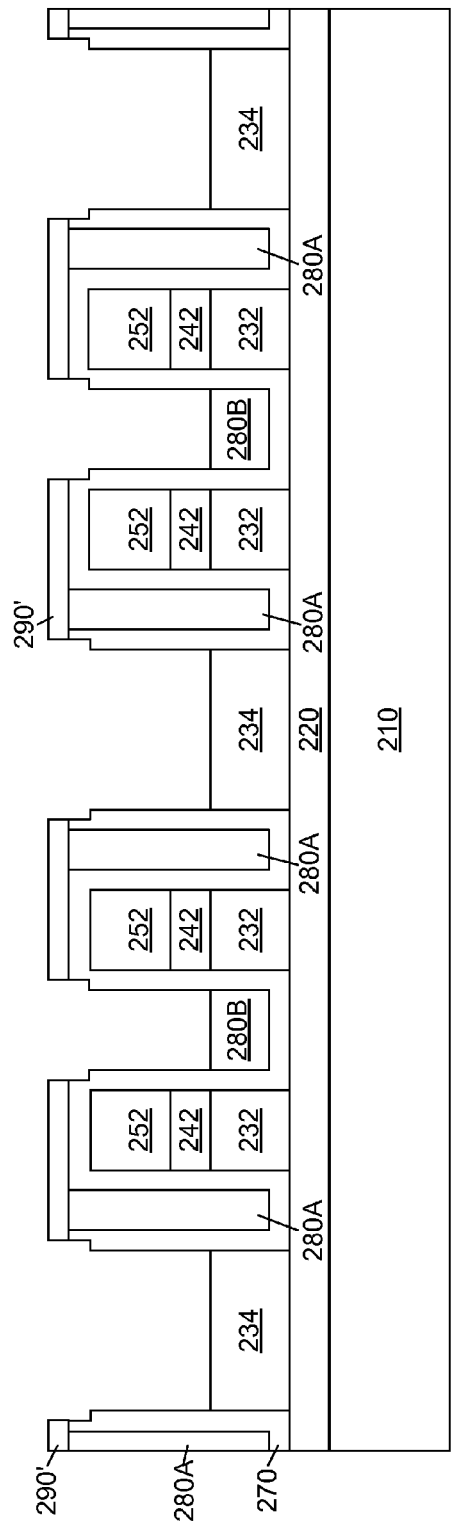

Referring to FIG. 13, the dummy dielectric layers 244 may then be removed from the dummy towers 264. In one or more embodiments, the removal process may include an etching process. In one or more embodiments, the etching process may include a dry etching process. In one or more embodiments, the etching process may include a wet etching process. In one or more embodiments, the etchant for the wet etching process may include HF and/or phosphoric acid.

Referring to FIG. 14, the dummy charge storage layers 234 (e.g. dummy charge storage structures) may then be removed from each of the dummy towers 264. The removal process may include an etching process such as a dry etching process. The removal of the dummy charge storage layers 234 may remove the remaining portions of the dummy towers 264. In one or more embodiments, it the case in which the dummy charge storage layers 234 comprise a dielectric material, it may be possible that some amount of the dummy charge storage layers 234 is left remaining.

Referring to FIG. 15, the dielectric layer portions 290' may be removed. In one or more embodiments, the removal process may comprise an etching process. In one or more embodiments, the etching process may comprise a dry etching process. In one or more embodiments, the etching process may comprise a wet etching process.

Figure 16:
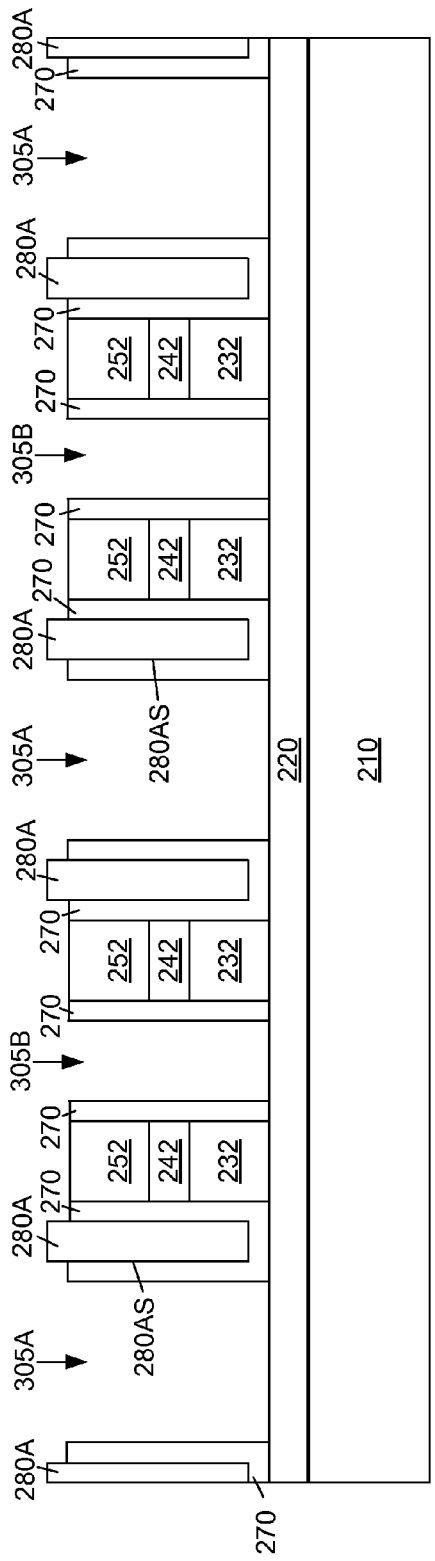

Referring to FIG. 16, the dielectric layer 270 may be etched so that certain exposed portions of dielectric layer 270 may be removed. The etching process may comprise a dry etching process. The etching process may comprise an anisotropic etching process. It is seen that dielectric layer 270 may remain along certain sidewall surfaces of the gate towers 262 as well as certain sidewall surfaces SS of the select gates 280A. Referring to FIG. 16, it is seen that after the removal of portions of dielectric layer 270, openings 305A and 305B are defined by the structure.

Figure 17:
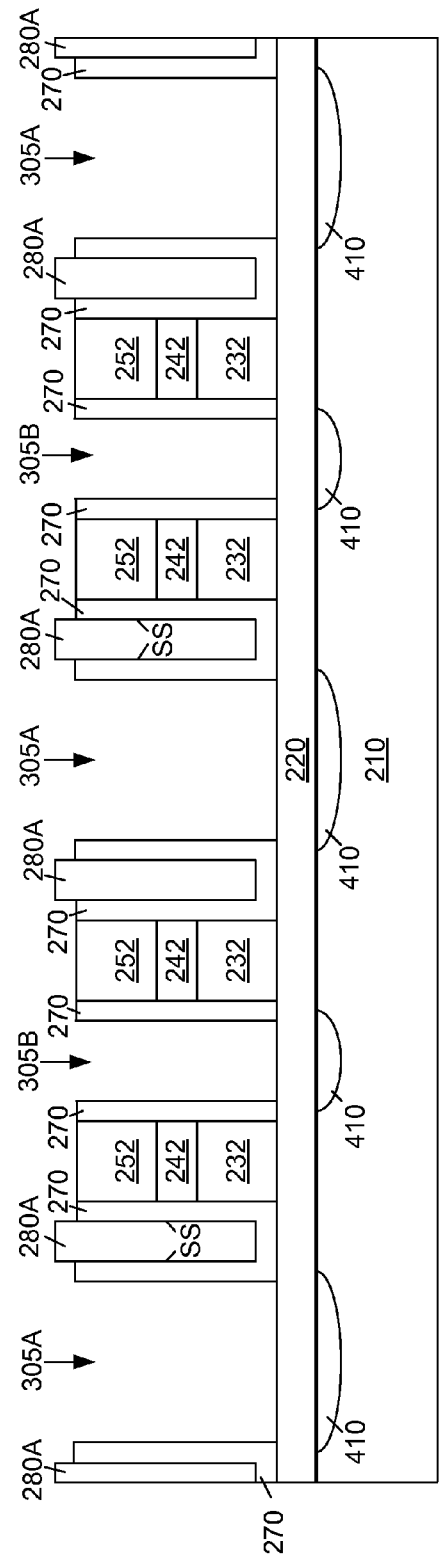

Referring to FIG. 17, extension regions 410 may be formed within the substrate 210. The extension regions 410 may be formed by the introduction of dopants. The dopants may be LDD (e.g. lightly doped drain) dopants. The LDD dopants may be introduced by an ion implantation process (e.g. an LDD implantation process). In one or more embodiments, it is possible that the LDD dopants may be introduced in ways other than by ion implantation. In one or more embodiments, the extension regions 410 may be n-type. In one or more embodiments, the extension regions 410 may be p-type. In one or more embodiments, the doping to form the extension regions 410 may also serve to dope the select gates 280A and/or the control gates 252.

Referring to FIG. 18, a dielectric layer 320 may be formed over the structure shown in FIG. 17 to form the structure shown in FIG. 18. The formation of dielectric layer 320 may be by a deposition process. The deposition process may be a substantially conformal deposition process. The dielectric layer 320 may formed over the sidewall and bottom surfaces of the openings 305A and 305B.

Referring to FIG. 19, the dielectric layer 320 may be subjected to an anisotropic etching process to form dielectric sidewall spacers 322,324. The spacers 322 may be formed over the sidewall surfaces of the openings 305A while the spacers 324 may be formed over the sidewall surfaces of the openings 305B. Still referring to FIG. 19, the dielectric layer 220 may also be etched within the openings 305A,B and where not protected by the sidewall spaces 322, 324. Within these regions, the dielectric layer 220 may be at least partially etched through.

Referring to FIG. 20, the structure shown in FIG. 19 may be subjected to a doping process to so that source/drain regions 420 are formed within the substrate 210 as shown in FIG. 20. The source/drain region 420 may be formed by the introduction of source/drain dopants. The source/drain dopants may be introduced by ion implantation such as by a source/drain implantation process. In one or more embodiments, the source/drain dopants may be introduced by ways other than by ion implantation.

In one more embodiments, the source/drain implantation may have about the same dosage that the LDD implantation. In one more embodiments, the source/drain implantation may have a higher dosage that the LDD implantation. In one or more embodiments, the source/drain implantation may penetrate deeper than the LDD implantation. In one or more embodiments, the dopant concentration in the source/drain regions 420 may be about the same as the dopant concentration is the extention regions 410. In one or more embodiments, the dopant concentration in the source/drain regions 420 may be greater than the dopant concentration is the extension regions 410. In one or more embodiments, the source/drain dopants may be of the same dopant type as the LDD dopants. In one or more embodiments, the source/drain dopants may be n-type. In one or more embodiments, the source/drain dopants may be p-type.

The structure shown in FIG. 20 includes electronic devices 510. The electronic device 510 may be semiconductor devices. The electronic devices 510 may be memory devices. Each of the electronic devices 510 may include a control gate 252, a charge storage structure 232 and a select gate 280A. In one or more embodiments, a charge storage structure may be a floating gate. In one or more embodiments, a charge storage structure may charge trapping structure.

In one or more embodiments, the select gates 280A may each be in the shape of a block. In one or more embodiments, the select gates 280A may each have a substantially rectangular shape. In one or more embodiments, the select gates 280A may each have substantially vertical sidewalls SS. In one or more embodiments, the select gates 280A may have substantially vertical gate thicknesses.

While not wishing to be bound by theory, the shape of the select gates 280A may play a role in determining the electrical characteristics of the resulting devices. If the select gates 280A are quasi-triangular in shape it is possible that the outer edge of the underlying dielectric (for example, oxide) layer 270 may not be protected with respect to the extension and source/drain implants. This may give rise to reliability issues. It may thus be useful that the outer sidewall of the select gates 280A (e.g. the sidewall remote to the gate stack), may comprise some vertical component in order for the select gates 280A to protect the underlying dielectric (for example, oxide) from the effects of unintentional implantation. Such a vertical component may additionally allow formation of an implant protecting spacer (for example, a dielectric spacer) later in the process.

In one or more embodiments, the select gates 280A may, or example, comprise polysilicon. The polysilicon may be a doped polysilicon. In one or more embodiments, the select gates 280A may comprise n-doped polysilicon. In one or more embodiments, the select gates 280A may comprise p-doped polysilicon. The doping may be performed by an implantation process (such as ion implantation) or it may be performed by an in-situ process. In one or more embodiments, the doping may be performed during the formation of the extension regions and/or the source/drain regions (explained below). The select gates 280A may comprise some other conductive material.

The resulting structure shown in FIG. 20 includes select gates 280A. A select gate 280A may be associated with a control gate 252 and a charge storage structure 232 of a device 520. The select gate 280A may be disposed lateral to the gate tower 262. The select gate 280A may be disposed lateral to the control gate 252 and to the charge storage layer 242. The select gate 280A may be proximate to the gate tower 262. The select gate 280A may be disposed lateral to the sidewall of the gate tower 262. The select gate 280A may be adjacent to a portion of dielectric layer 270 that is along a sidewall of the gate tower 262 (or a sidewall of the gate stack 266).

In is noted that, in one or more embodiments, the length LGS of the select gate 280A may be adjusted or controlled by adjusting the dimension L2 between the gate stack 260A and an adjacent dummy tower 264 (as shown in FIG. 3). In one or more embodiments, it may be possible to control the gate lengths LGS of the select gates 280A through design. In one or more embodiments, it may be possible to control the gate lengths LGS such that that the gate lengths LGS of the select gates 280A may be substantially the same dimension.

The structure shown in FIG. 20 shows a semiconductor structure 510 that includes one or more memory devices 520. The semiconductor structure 510 may, for example, be a semiconductor chip. The semiconductor chip may, for example, include an integrated circuit. One or both of the memory devices 520 may be part of the integrated circuit. The semiconductor structure 410 may, for example, be a semiconductor device.

The memory device 520 includes a charge storage structure 232, a control gate 252 and a select gate 280A. In one or more embodiments, the memory device 520 may be useful as memory devices such as a charge storage memory device.

In one or more embodiments, the charge storage structure 232 may be floating gates comprising floating gate material. The devices 510 may be referred to as floating gate devices. In one or more embodiments, the floating gates 232 may be formed of a doped polysilicon or some other conductive material. The doped polysilicon may be n-type doped or p-type doped. In one or more embodiments, the control gates 252 may, for example, be formed of a doped polysilicon or some other conductive material. The doped polysilicon may be n-type doped or p-type doped. In one or more embodiments, the select gates 280A may be formed of a doped polysilicon or some other conductive material. The doped polysilicon may be n-type doped or p-type doped. The first dielectric layer 220 may, for example, comprise an oxide (such as silicon dioxide—which may, for example, be formed by a growth process), a nitride, an oxynitride, or combinations thereof. The second dielectric layers 242 may, for example, comprise an oxide, a nitride, an oxynitride, or combinations thereof. The second dielectric layer 242 may comprise a high-k material. In one or more embodiments, the second dielectric layers 242 may comprise an oxide-nitride-oxide stack. Of course, the materials mentioned for a floating gate device are only examples and other materials may be substituted for the materials described.

In one or more embodiments, the floating gate devices may possibly be programmed by Fowler-Nordheim tunneling or by hot-carrier injection. In one or more embodiments, erasure may possibly be accomplished by UV emission or by Fowler-Nordheim tunneling. In one or more embodiments, it is possible that electrical charge may be stored on the floating gate so as to adjust the threshold voltage $V_T$ of the device. Of course, these are only examples of possible ways to operate a floating gate device and other ways may also be possible.

In one or more embodiments, the charge storage structures 232 may be charge trapping structures that comprise charge trapping material. In this case, the device 510 may be referred to as a charge trapping device. The charge trapping structures may, for example, comprise a nitride (such as silicon nitride), an oxynitride, a nanocrystalline material or a high-k material. In one or more embodiments, the charge storage structure 232 may be a charge trapping structure that comprises a dielectric material. The first dielectric layers 220 may, for example, comprise an oxide (such as a silicon dioxide). The oxide may, for example, be formed by a growth process. The second dielectric layers 242 may, for example, comprise an oxide and/or a high-k material. The control gate 252 may, for example, be a polysilicon material such as a doped polysilicon. The select gates 280A may, or example, comprise a polysilicon material such as a doped polysilicon. In one or more embodiments, the select gates 280A may comprise n-doped polysilicon. In one or more embodiments, the select gates 280A may comprise p-doped polysilicon. The doping may be performed by an implantation process (such as ion implantation) or it may be performed by an in-situ process. Of course, the materials described for a charge trapping device are only examples and other materials may be substituted for the materials described.

In one or more embodiments, a charge trapping device may possibly be programmed by applying a sufficiently high positive voltage to the control gates 252. This may lead to an electron tunneling current (for example, by Fowler-Nordheim tunneling) from the substrate 210 through the first dielectric layers 220 and toward the charge trapping layer 232, where the electrons may be trapped. The trapped electrons may give rise to an increased threshold voltage $V_T$ which may indicate that the device is programmed. In one or more embodiments, a charge trapping device may possibly be erased by applying a suitable negative voltage to the control gate. In one or more embodiments, as another example, a charge trapping device may possibly be programmed by hot-carrier injection. Of course, these are only examples of possible ways to possibly operate a charge trapping device and other ways may also be possible.

In one or more embodiments, the charge storage memory devices 520 shown in FIG. 20 may be stand-alone memory devices. In one or more embodiments, the charge storage memory devices 520 may be used as an embedded memory device in combination with at least one logic device on the same chip or the same substrate. Hence, the same chip (or same substrate) may include a memory portion (with one or more memory devices) and a logic portion (with one or more logic devices).

Referring again, for example, to FIG. 8, in one or more embodiments of the invention, it may also be possible that one or more of the additional gate structures 280B may not be etched but may instead be allowed to remain. Hence, it may be possible that the masking portions 310' be extended to overlie one or more of the additional gate structures 280B. This may result in the semiconductor structure shown in FIG. 21 which is a semiconductor structure in accordance with an embodiment of the invention. Referring to FIG. 21, the additional gate structures 280B have been allowed to remain. In some embodiments, the additional gate structures 280B may be useful as erase gates. In one or more embodiments, the erase gate 280B may comprise the same material as the select gate 280A. In one or more embodiments, the erase gate 280B may comprise a conductive material such as polysilicon (e.g. doped polysilicon). Hence, in one or more embodiments, a device 520 may be formed that includes a control gate, a charge storage structure (that may be a floating gate or a charge trapping structure), a select gate and an erase gate. It is conceivable that each erase gate 280B may be associated with the corresponding gate towers 262 on both sides of the erase gate 280B. Hence, it is possible that two adjacent devices may share an erase gate 280B.

In one or more embodiments, it is possible that one or more embodiments of the methods described herein may provide a more cost effective and/or more efficient means of making one or more semiconductor devices.

One or more embodiments relate to a method of forming a memory device, comprising: forming a first dielectric layer over a substrate; forming a charge storage layer over the first dielectric layer; forming a second dielectric layer over the charge storage layer; forming a control gate layer over the second dielectric layer; patterning the control gate layer, the second dielectric layer and the charge storage layer to form a gate tower and a dummy tower laterally spaced apart from the gate tower; and forming a select gate between the gate tower and the dummy tower.

One or more embodiments relate to a method of forming a memory device, comprising: forming a first dielectric layer over a substrate; forming a charge storage layer over the first dielectric layer; forming a second dielectric layer over the charge storage layer; forming a control gate layer over the second dielectric layer; patterning the control gate layer, the second dielectric layer and the charge storage layer to form a gate tower and a dummy tower laterally spaced apart from the gate tower; and forming an additional gate layer between the gate tower and the dummy tower.

One or more embodiments relate to a method for forming a memory device, the memory device including a control gate, a charge storage structure and a select gate, the method comprising: forming a gate tower, the gate tower including the control gate over the charge storage structure; forming a dummy tower laterally spaced apart from the gate tower; and forming a select gate between the gate tower and the dummy tower.

A method for forming a memory device, the memory device including a control gate, a charge storage structure and a select gate, the method comprising: forming a gate tower, the gate tower including the control gate over the charge storage structure; forming a dummy tower laterally spaced apart from the gate tower; and forming a select gate between the gate tower and the dummy tower.

One or more embodiments relate to a method for forming a memory device, the memory device including a control gate, a charge storage structure and a select gate, the method comprising: forming a gate tower, the gate tower including the control gate over the charge storage structure; forming a dummy tower laterally spaced apart from the gate tower; and forming a conductive layer at least between the gate tower and the dummy tower.

Although the invention has been described in terms of certain embodiments, it will be obvious to those skilled in the art that many alterations and modifications may be made without departing from the invention. Accordingly, it is intended that all such alterations and modifications be included within the spirit and scope of the invention.

What is claimed is:

1. A method of forming a memory device, comprising:
   forming a first dielectric layer over a substrate;
   forming a charge storage layer over said first dielectric layer;
   forming a second dielectric layer over said charge storage layer;
   forming a control gate layer over said second dielectric layer;
   patterning said control gate layer, said second dielectric layer and said charge storage layer to form a gate tower and a dummy tower laterally spaced apart from the gate tower;
   forming a select gate between said gate tower and said dummy tower; and
   removing said dummy tower after forming said select gate.

2. The method of claim 1, wherein said forming said select gate comprises
   forming an additional gate layer at least between said gate tower and said dummy tower; and
   removing a portion of said additional gate layer.

3. The method of claim 2, wherein said removing said portion of said additional gate layer comprises etching said additional gate layer.

4. The method of claim 3, wherein said etching is performed without a mask.

5. The method of claim 1, wherein said select gate comprises a conductive material.

6. The method of claim 5, wherein said conductive material comprises doped polysilicon.

7. The method of claim 1, wherein said charge storage layer comprises a floating gate material or a charge trapping material.

8. The method of claim 1, wherein said patterning comprises an etching process.

9. A method of forming a memory device, comprising:
   forming a first dielectric layer over a substrate;
   forming a charge storage layer over said first dielectric layer;
   forming a second dielectric layer over said charge storage layer;
   forming a control gate layer over said second dielectric layer;
   patterning said control gate layer, said second dielectric layer and said charge storage layer to form a gate tower and a dummy tower laterally spaced apart from the gate tower;
   forming an additional gate layer between said gate tower and said dummy tower; and
   removing said dummy tower after forming said additional gate layer.

10. The method of claim 9, further comprising removing a portion of said additional gate layer to form a select gate before removing said dummy tower.

11. The method of claim 9, wherein said patterning comprises an etching process.

* * * * *